United States Patent [19]

Hosokura

[11] Patent Number: 6,156,094
[45] Date of Patent: Dec. 5, 2000

[54] METHOD FOR PRODUCING METAL POWDER

[75] Inventor: Tadasu Hosokura, Omihachiman, Japan

[73] Assignee: Murata Manufacturing Co., Ltd., Japan

[21] Appl. No.: 09/394,491

[22] Filed: Sep. 13, 1999

[30] Foreign Application Priority Data

Sep. 11, 1998 [JP] Japan .................................. 10-258390

[51] Int. Cl.$^7$ ...................................................... B22F 9/18
[52] U.S. Cl. ................................ 75/343; 75/348; 75/371; 75/374
[58] Field of Search ............................... 75/343, 348, 370, 75/374, 371

[56] References Cited

U.S. PATENT DOCUMENTS

| | | |
|---|---|---|
| 3,679,398 | 7/1972 | Geus . |
| 3,708,313 | 1/1973 | Short . |
| 4,089,676 | 5/1978 | Grundy . |
| 4,101,311 | 7/1978 | Aonuma et al. . |
| 4,456,473 | 6/1984 | Jost . |
| 4,456,474 | 6/1984 | Jost . |
| 4,721,524 | 1/1988 | Sheldon et al. . |
| 5,413,617 | 5/1995 | Lin et al. . |

FOREIGN PATENT DOCUMENTS

0154534  3/1985  European Pat. Off. .

OTHER PUBLICATIONS

Patent Abstracts of Japan; vol. 12, No. 374 (M–749); Oct. 6, 1988 & JP 63–125605 A (Daido Steel Co., Ltd); May 28, 1988; Abstract.

Chemical Abstracts; vol. 120, No. 2; Jan. 10, 1994; Columbus, Ohio, U.S.; Abstract No. 12280; Zavodna, Ivana, et al.; "Platinum recovery from waste solutions and suspensions"; XP002126501; Abstract & CS 275 580 B (Lachema S.P. Czech.)

Patent Abstracts of Japan; vol. 016, No. 284 (M–1270); Jun. 24, 1992 & JP 04 074810 A (Agency of Ind. Science & Technol.) Mar. 10, 1992; Abstract.

*Primary Examiner*—Ngoclan Mai
*Attorney, Agent, or Firm*—Ostrolenk, Faber, Gerb & Soffen, LLP

[57] ABSTRACT

A method for producing metal powder which involves the step of making an alkaline hydroxide, hydrazine or a hydrazine hydrate, and a metallic salt co-exist in a solvent comprising an alcohol, at least a portion of each being dissolved; wherein, in the step, metal powder comprising a metal contained in the metallic salt is precipitated by reducing the metallic salt with the hydrazine or the hydrazine hydrate. By the above method, a metal powder having a particle size of about 100 nm or less can be obtained and the metal powder is not contaminated with impurities originating from the reducing agent.

18 Claims, No Drawings

METHOD FOR PRODUCING METAL POWDER

BACKGROUND OF THE INVENTION

1. Field of the Invention

The present invention relates to metal powder, a method for producing the same and conductive paste. More particularly, the invention relates to conductive paste, for example, which is advantageously used for forming internal conductors of monolithic ceramic electronic components, a metal powder contained therein and a method for producing such metal powder.

2. Description of the Related Art

A conductive paste is used for forming internal conductors of monolithic ceramic electronic components, such as monolithic ceramic capacitors. The conductive paste contains metal powder as a conducting component. As the metal powder, nickel powder is frequently used.

As the size and thickness of such monolithic ceramic electronic components is decreased, the particle size of the metal powder contained in the internal conductor must be decreased.

One method for advantageously producing a metal powder having a small particle size is a vapor phase process. However, the production cost of metal powder is high in the vapor phase process.

On the other hand, a method for producing metal powder having a small particle size by a liquid phase process is disclosed, for example, in Japanese Examined Patent Publication No. 6-99143. The patent publication discloses a method for producing nickel powder in which a powder having a small particle size is obtained by the step of subjecting a nickel salt solution to liquid-phase reduction using a solution of a boron hydroxide such as sodium boron hydroxide as a reducing agent. In accordance with this method, however, since boron precipitates as an alloy or impurity in the nickel powder, the resultant nickel powder is not always suitable as a conductive component for conductive paste.

A method for producing metal powder by a liquid phase process is also disclosed in Japanese Unexamined Patent Publication No. 5-43921. The patent publication discloses a method for producing nickel powder in which a solution containing basic nickel carbonate is reduced and hydrazine is used as a reducing agent. Since hydrazine is used as a reducing agent, nickel powder will not be contaminated with impurities. However, the resultant nickel powder has a particle size of more than 100 nm and thus being undesirable as a conductive component for a conductive paste for forming internal conductors in which the thickness thereof must be decreased.

SUMMARY OF THE INVENTION

To overcome the above described problems, preferred embodiments of the present invention provide a method for producing a metal powder by a liquid phase process in which metal powder having a particle size of about 100 nm or less can be obtained, and a mixture of impurities originating from a reducing agent does not occur.

Further, preferred embodiments of the present invention provide a metal powder having a particle size of about 100 nm or less which is obtained by the producing method described above and is not contaminated with impurities originating from a reducing agent.

Further, preferred embodiments of the present invention provide a conductive paste which can be advantageously used for forming internal conductors with the aim of decreasing the thickness of monolithic ceramic electronic components.

One preferred embodiment of the present invention provides a method for producing a metal powder comprising the step of providing an alkaline hydroxide, hydrazine or a hydrazine hydrate, and a metallic salt in a solvent containing at least an alcohol, at least a portion of each being dissolved. In this step, a metal powder composed of a metal contained in the metallic salt is precipitated by reduction of the metallic salt with hydrazine or the hydrazine hydrate.

In such a method for producing metal powder, the hydrazine or a hydrazine hydrate (hereinafter both referred to simply as "hydrazine") does not greatly precipitate impurities in the metal that has been reduced therewith.

When hydrazine or a hydrazine hydrate reduces a metal, hydroxide ions must be supplied, and such hydroxide ions are supplied by the alkaline hydroxide. As the alkalinity increases, the rate of the reduction reaction is increased, resulting in a smaller size of the resultant metal powder. Therefore, by changing alkaline strength, that is, by changing the concentration of the alkaline hydroxide in the reducing agent solution or the type of alkaline hydroxide, the particle size of the precipitated metal powder can be controlled. When a solvent composed of an alcohol only is used, the reduction reaction of hydrazine does not proceed unless an alkaline hydroxide is present.

In a method for producing metal powder in accordance with the present invention, a solvent containing an alcohol is used instead of water as the solvent for dissolving hydrazine or the metallic salt. As the solvent containing an alcohol, an alcohol only may be used or a mixture of an alcohol and water may be used. By using a solvent containing an alcohol as the solvent, instead of water only, the solubility of metallic ions can be decreased, thus enabling an increase in the precipitation rate of the metal and a decrease in the particle size of the precipitated metal powder in comparison with a case of using water only as the solvent. Therefore, by changing the alcohol concentration in the mixture of the alcohol and water as the solvent, the particle size of the precipitated metal powder may also be controlled.

Preferably, in order to make an alkaline hydroxide, hydrazine or a hydrazine hydrate and a metallic salt exist in the solvent as described above, a reducing agent solution which is obtained by dissolving an alkaline hydroxide and hydrazine or a hydrazine hydrate in a solvent containing at least an alcohol is prepared. At the same time, a metallic salt solution, which is obtained by dissolving a metallic salt in a solvent containing at least an alcohol is prepared, and the reducing agent solution and the metallic salt solution are mixed.

The concentration of the alcohol in the solvent described above is preferably in the range of from about 10% to 100% by volume. If the concentration is less than about 10% by volume, the particle size of the metal powder will not substantially differ from that of metal powder which has been produced by reduction in water by a conventional method.

The concentration of the alkaline hydroxide contained in the reducing agent solution is preferably in the range of from about four times the concentration of the hydrazine or hydrazine hydrate used up to about 10 moles/liter. If the concentration is less than about four times the concentration of the hydrazine or hydrazine hydrate, the reduction reaction does not finish. On the other hand, if the concentration is more than about 10 moles/liter, the alkaline hydroxide is not dissolved in the solvent.

The concentration of the hydrazine or hydrazine hydrate contained in the reducing agent solution is preferably in the range of from the amount stoichiometrically required for reducing the metallic salt to about 20 moles/liter.

If the concentration is less than the amount stoichiometrically required for reducing the metallic salt, the reduction reaction does not finish. On the other hand, if the concentration is more than about 20 moles/liter, the effect of using an alcohol as the solvent is lessened because hydrazine is a liquid at room temperature.

The concentration of the metallic salt contained in the metallic salt solution is preferably about 10 moles/liter or less. If the concentration exceeds about 10 moles/liter, the metallic salt is not dissolved in the solvent.

The present invention is also directed to metal powder obtained in accordance with the producing methods as described above. Preferably, the metal powder has a particle size of about 100 nm or less.

The present invention is also directed to conductive paste containing such metal powder.

Preferably, the conductive paste is used for forming internal conductors of monolithic ceramic electronic components.

DESCRIPTION OF THE PREFERRED EMBODIMENTS

When metal powder is produced in accordance with a preferred embodiment of the present invention, firstly, a reducing agent solution, which is obtained by dissolving an alkaline hydroxide and hydrazine or a hydrazine hydrate in a solvent containing at least an alcohol, is prepared.

As the alcohol, preferably, at least one monovalent alcohol selected from the group consisting of methanol, ethanol and propanol is used.

As the alkaline hydroxide, for example, at least one selected form the group consisting of potassium hydroxide, sodium hydroxide, calcium hydroxide, barium hydroxide and ammonium hydroxide is used.

In a more specifically preferred embodiment, ethanol alone is used as the solvent, and as the alkaline hydroxide, sodium hydroxide alone is used. In order to obtain a reducing agent solution, sodium hydroxide is dissolved in ethanol at a molarity of about 0.5 to 5.0 moles/liter, and hydrazine or a hydrazine hydrate is dissolved in the range of from the amount stoichiometrically required for reducing a metallic salt to about 15 times the required amount.

On the other hand, a metallic salt solution, which is obtained by dissolving a metallic salt in a solvent containing at least an alcohol, is prepared.

As the alcohol, the same as in the reducing agent solution described above is used, that is, preferably, at least one monovalent alcohol such as methanol, ethanol, and propanol is used. In general, the monovalent alcohol has a higher capacity of dissolving a metallic salt than that of a polyhydric alcohol, and thus the productivity of metal powder can be increased.

As the metallic salt, depending on the type of metal powder to be obtained, for example, a salt containing at least one metallic element selected from the group consisting of Au, Ag, Pd, Cu, Ni, Co, Fe and Mn is used. The metallic salt containing the metallic element described as an example can precipitate a specific metal alone or as an alloy by being reduced with hydrazine, and the metallic element contained in the metallic salt demonstrates conductivity, thus enabling a use for a conductive material, such as a conductive paste, for electronic components.

The metallic salt is, for example, at least one salt selected from the group consisting of a chloride, a sulfate and a nitrate. Preferably, the metallic salt is satisfactorily dissolved in a solvent comprising an alcohol or a mixture of an alcohol and water.

In a more specifically preferred embodiment, ethanol alone is used as the solvent, and as the metallic salt, a chloride containing at least one metallic element selected from the group consisting of Au, Ag, Pd, Cu, Ni, Co, Fe and Mn is used alone. In order to obtain a metallic salt solution, the chloride is dissolved in ethanol at a molarity of about $1.0 \times 10^{-2}$ to about 1.0 mole/liter.

Next, the reducing agent solution and the metallic salt solution obtained as described above are mixed.

Preferably, the temperatures of the reducing agent solution and the metallic salt solution are controlled in the range of from 20° C. to 60° C. When mixing is performed, the metallic salt solution is preferably added dropwise to the reducing agent solution that is being stirred.

By mixing the reducing agent solution and the metallic salt solution as described above, the metallic salt contained in the metallic salt solution is reduced with the hydrazine or hydrazine hydrate. Thus, a particulate metal powder having a particle size of about 15 nm to 100 nm and having a uniform particle size is produced by precipitation. Since the metal powder is precipitated as a loose (that is, easily shredded) aggregate during the reduction reaction described above, recovery is easy in the subsequent step, thus enabling excellent productivity. Since hydrazine is used as the reducing agent, the metal powder is not contaminated with impurities originating from the reducing agent. Even if the aggregation is insufficient, recovery may be performed easily by separately adding an additive.

Next, the metal powder is washed, followed by drying. Thus, desired metal powder can be obtained.

By dispersing the resultant metal powder into an appropriate vehicle, a conductive paste can be obtained. The components of the paste, other than the metal powder are conventional. The conductive paste is used for forming internal conductors of monolithic ceramic electronic components, such as internal electrodes of monolithic ceramic capacitors.

The metal powder contained in the conductive paste is an excellent conductive component because it is not contaminated with impurities originating from a reducing agent. Since the metal powder has a particle size of about 100 nm or less, by using the conductive paste containing the metal powder for forming internal conductors of monolithic ceramic electronic components, a decrease in the thickness of the ceramic electronic components can be advantageously achieved.

In the embodiment described above, the reducing agent solution and the metallic salt solution are prepared separately, and the reducing agent solution and the metallic salt solution are mixed so that the reduction reaction of the metallic salt with hydrazine occurs. However, the invention is not limited to this. For example, a solution for dissolving an alkaline hydroxide, a solution for dissolving hydrazine, and a solution for dissolving a metallic salt may be prepared separately, and in order to generate a reduction reaction, these three solutions may be mixed. Alternatively, the reducing agent solution described above alone may be prepared, and a metallic salt may be added thereto directly, or the metallic salt solution described above alone may be prepared and an alkaline hydroxide and hydrazine may be added thereto.

As described above, although various modifications may be made, in short, in order to generate the desired reduction reaction in which metal powder comprising a metal contained in a metallic salt is precipitated by reducing the metallic salt with hydrazine, a method for producing metal powder must include a step of making an alkaline hydroxide, hydrazine or a hydrazine hydrate, and a metallic salt exist in a solvent containing at least an alcohol, at least a portion of each being dissolved.

With respect to a method for producing metal powder, preferred examples and comparative examples in accordance with the present invention will be described below.

EXAMPLE 1

A reducing agent solution was prepared by dissolving 2 g of sodium hydroxide and 5 g of 80% hydrazine hydrate in 100 ml of ethanol. On the other hand, 5 g of nickel chloride was dissolved in 100 ml of ethanol to prepare a metallic salt solution.

Next, with the temperatures of both solutions being kept at 60° C., the metallic salt solution was introduced into the reducing agent solution. After nickel powder was precipitated, the nickel powder was separated and recovered, followed by washing with pure water and acetone in that order. Drying was then performed in an oven.

The resultant nickel powder was observed with a scanning electron microscope, and it was confirmed that spherical nickel powder of 40 to 60 nm had been obtained.

EXAMPLE 2

A reducing agent solution was prepared by dissolving 7.5 g of potassium hydroxide and 40 g of 80% hydrazine hydrate in 100 ml of methanol. On the other hand, 10 g of copper nitrate was dissolved in a mixture of 100 ml of methanol and 10 ml of pure water to prepare a metallic salt solution.

Next, with the temperatures of both solutions being kept at 50° C., the metallic salt solution was introduced into the reducing agent solution which was being stirred. After copper powder was precipitated, the copper powder was separated and recovered, followed by washing with pure water and acetone in that order. Next, drying was performed at room temperature.

The resultant copper powder was observed with a scanning electron microscope, and it was confirmed that spherical copper powder of 60 to 80 nm had been obtained.

Comparative Example 1

Except that sodium hydroxide as an alkaline hydroxide was not used, an operation was performed in order to obtain nickel powder under the same conditions as in example 1. A reduction reaction did not occur and nickel powder was not precipitated. This is because of the fact that the reduction reaction with hydrazine does not proceed in the absence of an alkaline hydroxide.

Comparative Example 2

Except that ion-exchanged water only was used as a solvent instead of ethanol, an operation was performed in order to obtain nickel powder under the same conditions as in example 1.

The resultant nickel powder was observed with a scanning electron microscope, and it was confirmed that spherical nickel powder having a particle size of 400 to 500 nm, which was larger than that in example 1, had been obtained. This is because of the fact that when water only is used as a solvent for reaction, the solubility of nickel ions increases, resulting in a decrease in the precipitation rate of nickel.

In a method for producing metal powder in accordance with the present invention, an alkaline hydroxide, hydrazine or a hydrazine hydrate, and a metallic salt are made to exist in a solvent containing at least an alcohol, at least a portion of each being dissolved. In this state, while hydroxide ions from the alkaline hydroxide are being supplied, the metallic salt is reduced with the hydrazine or hydrazine hydrate, and thus metal powder comprising a metal contained in the metallic salt is precipitated.

As described above, in the method for producing metal powder in accordance with the present invention, since hydrazine or a hydrazine hydrate is used as a reducing agent, a metal powder which is not contaminated with impurities originating from the reducing agent can be obtained.

Since a solvent containing an alcohol is used as the solvent for dissolving the hydrazine or hydrazine hydrate and the metallic salt described above, the solubility of the metallic ions can be decreased in comparison with a case when water only is used as a solvent, and thus the precipitation rate of the metal can be increased, resulting in a decrease in the particle size of precipitated metal powder. Metal powder having a particle size of 100 nm or less and having a small variation in the particle size can be obtained.

In the method for producing metal powder in accordance with the present invention, by preparing a reducing agent solution obtained by dissolving an alkaline hydroxide and hydrazine or a hydrazine hydrate in a solvent containing at least an alcohol, by preparing a metallic salt solution obtained by dissolving a metallic salt in a solvent containing at least an alcohol, and by mixing the reducing agent solution and the metallic salt solution, an operation for obtaining a state in which the alkaline hydroxide, the hydrazine or hydrazine hydrate, and the metallic salt exist in the solvent described above can be facilitated.

When the reducing agent solution and the metallic salt solution is mixed as described above, if the metallic salt solution is added dropwise to the reducing agent solution, control for stably generating a reduction reaction can be facilitated, and thus a metal powder with stable quality can be easily produced.

When the reducing agent solution is prepared as described above, the particle size of the precipitated metal powder can be controlled by changing the concentration and/or type of the alkaline hydroxide in the reducing agent solution. Thus, the particle size of the metal powder to be obtained can be relatively easily controlled.

In the method for producing metal powder in accordance with the present invention, the particle size of metal powder to be precipitated can be controlled by using a mixture of an alcohol and water as the solvent. Thus, the particle size of the metal powder to be obtained can also be relatively easily controlled.

Since metal powder in accordance with the present invention is obtained in the producing method as described above, the metal powder is not contaminated with impurities originating from the reducing agent and the metal powder has a particle size of about 100 nm or less. By providing conductive paste containing such metal powder for forming internal conductors of monolithic ceramic electronic components, the thickness of the monolithic ceramic electronic components can be advantageously decreased.

What is claimed is:

1. A method for producing metal powder, comprising the step of:

combining an alkaline hydroxide, hydrazine or a hydrazine hydrate, and a metallic salt in a solvent which comprises at least about 10 volume percent of a 1 to 3 carbon atom alcohol such that at least a portion of each is dissolved therein, wherein the metallic salt concentration is about 10 moles/liter or less and the concentration of the hydrazine or hydrazine hydrate is from the amount stoichiometrically required for reducing the metallic salt to about 20 moles/liter, whereby a metal powder comprising a metal contained in the metallic salt is precipitated from the solvent.

2. The method according to claim 1, wherein the step of combining an alkaline hydroxide, hydrazine or a hydrazine hydrate, and a metallic salt in a solvent comprises the steps of:

preparing a reducing agent solution by dissolving an alkaline hydroxide and hydrazine or a hydrazine hydrate in a solvent comprising an alcohol;

preparing a metallic salt solution by dissolving a metallic salt in a solvent comprising an alcohol; and mixing the reducing agent solution and the metallic salt solution.

3. The method according to claim 2, wherein the metallic salt solution is added dropwise to the reducing agent solution.

4. The method according to claim 3, wherein the metallic element contained in the metallic salt is at least one element selected from the group consisting of Au, Ag, Pd, Cu, Ni, Co, Fe and Mn.

5. The method according to claim 4, wherein the metallic salt is a chloride, a sulfate or a nitrate.

6. The method according to claim 5, wherein the alcohol is a monovalent alcohol.

7. The method according to claim 6, wherein the alkaline hydroxide is at least one selected from the group consisting of potassium hydroxide, sodium hydroxide, calcium hydroxide, barium hydroxide and ammonium hydroxide.

8. The method according to claim 1, wherein the alkaline hydroxide concentration is up to about 10 moles/liter.

9. The method according to claim 8, wherein the alkaline hydroxide concentration is at least about four times the concentration of the hydrazine or hydrazine hydrate.

10. The method according to claim 9, wherein the solvent comprises a mixture of alcohol and water in which the alcohol concentration is at least about 10 volume percent.

11. The method according to claim 1, wherein the metallic element contained in the metallic salt is at least one element selected from the group consisting of Au, Ag, Pd, Cu, Ni, Co, Fe and Mn.

12. The method according to claim 11, wherein the metallic salt is a chloride, a sulfate or a nitrate.

13. The method according to claim 1, wherein the alcohol is a monovalent alcohol.

14. The method according to claim 1, wherein the alkaline hydroxide is at least one selected from the group consisting of potassium hydroxide, sodium hydroxide, calcium hydroxide, barium hydroxide and ammonium hydroxide.

15. The method according to claim 1, wherein the alcohol is a 1 to 3 carbon atom monovalent alcohol and constitutes at least about 10 volume percent of the solvent, the metallic salt concentration is about 10 moles/liter or less, the alkaline hydroxide concentration is from about four times the concentration of the hydrazine or hydrazine hydrate up to about 10 moles/liter and the concentration of the hydrazine or hydrazine hydrate is from the amount stoichiometrically required for reducing the metallic salt to about 20 moles/liter.

16. The method according to claim 1, wherein the solvent comprises a mixture of alcohol and water in which the alcohol concentration is at least about 10 volume percent.

17. The method according to claim 16, further comprising the step of selecting the alcohol concentration in the mixture of the alcohol and water so as to control the particle size of the precipitated metal powder.

18. The method for producing metal powder according to claim 1, further comprising the step of selecting the concentration or type of the alkaline hydroxide in the reducing agent solution or both so as to control the particle size of the precipitated metal powder.

* * * * *